United States Patent [19]

Hansen et al.

[11] Patent Number: 4,564,251
[45] Date of Patent: Jan. 14, 1986

[54] LEADLESS CHIP CARRIER ADAPTER

[75] Inventors: William D. Hansen, Bell Gardens; Raymond F. Mix, Pomona, both of Calif.

[73] Assignee: ITT Corporation, New York, N.Y.

[21] Appl. No.: 681,155

[22] Filed: Dec. 13, 1984

[51] Int. Cl.⁴ .............................................. H01R 9/09
[52] U.S. Cl. .............................. 339/17 CF; 29/593; 29/832; 324/73 PC; 324/154 F; 339/75 MP; 339/92 M
[58] Field of Search .......... 339/17 CF, 75 M, 75 MP, 339/154 A, 156 R, 92 M; 29/832, 593; 324/73 PC, 154 F

[56] References Cited

U.S. PATENT DOCUMENTS

| | | | |
|---|---|---|---|
| 3,340,439 | 9/1967 | Henschen et al. | 339/17 CF |
| 4,437,718 | 3/1984 | Selinko | 339/75 M |
| 4,516,072 | 5/1985 | Marpoe, Jr. | 324/158 F |

Primary Examiner—John McQuade
Attorney, Agent, or Firm—T. L. Peterson; R. C. Turner

[57] ABSTRACT

An adapter is described for making connection between the contact pads of a LCC (Leadless Chip Carrier) and the terminals of an ordinary low-cost socket that normally receives the LCC and connects it to a printed circuit board, while also providing connections for test equipment to monitor the interface between the LCC and the printed circuit, or just the LCC, or just the printed circuit. The adapter includes a base element which fits into the socket and which has multiple pads that contact the terminals of the socket, and a test interfacer which attaches to the base element and extends upwardly therefrom. The interfacer has a receiver for receiving a LCC and has leads that extend between the pads of the LCC and the pads of the base element. The leads also have portions that are accessible from the outside so tat test equipment can be connected to them to monitor the interface between the LCC and the socket which connects to the printed circuit board.

7 Claims, 2 Drawing Figures

000
LEADLESS CHIP CARRIER ADAPTER

BACKGROUND OF THE INVENTION

It is often desirable to monitor signals being transmitted between a LCC (Leadless Chip Carrier) and the circuit of a printed circuit board to which the LCC is connected. The LCC is typically held in a LCC socket which plugs into the circuit board. A simple low-cost LCC socket does not have any exterior terminals for connection to test equipment. It is possible to use a special LCC socket with such externally-accessible terminals, but if it is desired to make a test on an ordinary circuit then it would be necessary to remove the socket already in place and replace it with a special purpose socket. An adapter which permitted the testing of signals passing between an LCC and an ordinary low-cost socket which normally holds the LCC, would aid in the testing of circuits. Such an adapter would be even more useful if it permitted separate testing of the circuit connected to the socket in the absence of the LCC, and separately permitted testing of the LCC when it was not connected to the circuit to which the socket is connected.

SUMMARY OF THE INVENTION

In accordance with one embodiment of the present invention, an adapter is provided for making connections between a LCC (Leadless Chip Carrier) and an ordinary low-cost socket designed to hold the LCC, while also providing for connections to outside test equipment to monitor the interface between the LCC and the socket. The adapter can include a base element which is shaped so that it fits into the socket, and which has conductive pads forming the same contact footprint as a LCC. The adapter also includes a test interfacer which includes a frame with a receiver for receiving a LCC, and a multiplicity of leads. Each lead extends between the receiver and the pads of the base element to connect them so that the pads of the LCC are connected to terminals of the socket as though the LCC were directly held by the socket. The leads include externally-accessible test terminal portions to which test equipment can be connected to monitor signals passing between the LCC in the receiver of the interfacer and the terminals of the socket.

The novel features of the invention are set forth with particularly in the appended claims. The invention will be best understood from the following description when read in conjunction with the accompanying drawings.

DESCRIPTION OF THE PREFERRED EMBODIMENT

Figure 1:
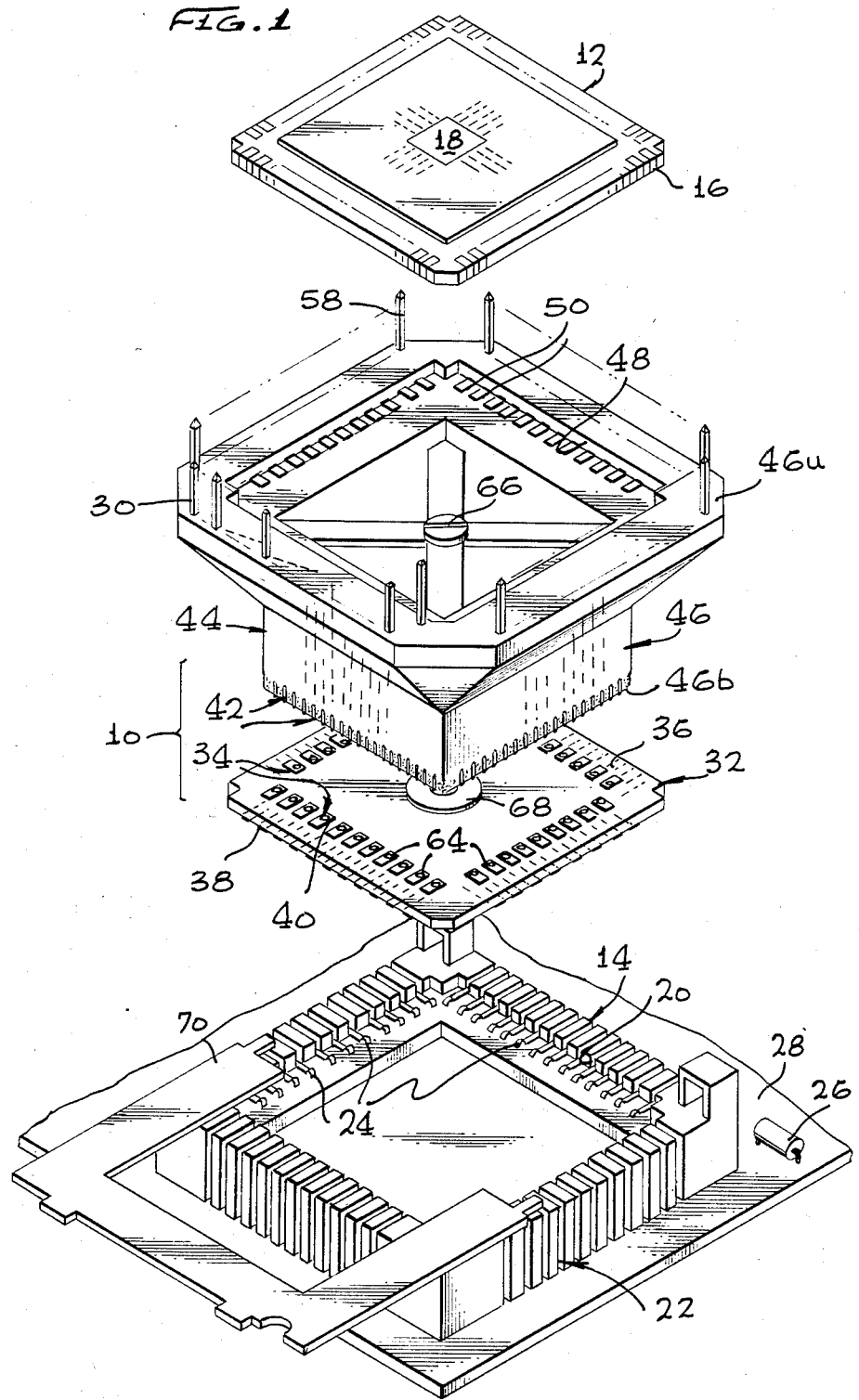
FIG. 1 is an exploded view of an adapter of the present invention, and also showing a LCC (Leadless Chip Carrier) and a LCC socket with which the adapter is used.

FIG. 1 illustrates an adapter 10 which can be used to make connections between a LCC (Leadless Chip Carrier) 12 and a LCC socket 14. The LCC 12 has contact pads 16 at its periphery, that are connected to an integrated circuit chip 18. The LCC is designed for installation directly in the socket 14 by laying the LCC into a recess 20 in a frame 22 of the socket, so that the pads 16 of the LCC engage socket terminals 24. The terminals 24 are connected to a circuit 26 on a printed circuit board 28. The adapter 10 is designed to connect the pads 16 of the LCC to the terminals 24 of the socket so the integrated circuit of the LCC 12 can interact with the circuit 28 on the printed circuit board, and to also provide outward external terminals 30 that are accessible for connection to external test equipment that can monitor the signals passing between the LCC 12 and the socket 14.

The adapter 10 includes a base element 32 that is shaped to fit into the LCC socket 14 in the same manner as the LCC 12. The base element 32 has multiple contact pads 34 mounted on the base element frame 36. The pads 34 have peripheral portions 38 that extend to the periphery of the frame 36, so that when the base element 32 is installed in the socket 14, the peripheral pad portion 38 will make contact with the socket terminals 24. The contact pads 34 of the base element also have inner portions 40 spaced from the periphery of the base element frame, and which are designed to make contact with leads 42 on a test interfacer 44.

The interfacer includes a frame 46 which forms a receiver 48 at its upper end which receives the LCC 12. The leads 42 extend from the lower end 46b of the frame to the upper end 46u, where the upper ends of the leads have inner portions 50 that can engage the contact pads 16 of the LCC when the LCC is in the receiver 48. The upper ends of the leads have outer portions formed by the terminals 30 in the form of upstanding pins, that enable connection to external test equipment. When the system is assembled, with the base element 32 installed in the socket 14, the interfacer 44 installed on the base element 32, and the LCC 12 installed in the interfacer, power and signals can pass between the circuit 26 on the circuit board and the LCC 12, so that the entire circuit can operate in a normal fashion. However, test equipment connected to the terminals 30 will be connected to the interface between the LCC and the socket 14, and can monitor the signals transmitted between them.

Figure 2:
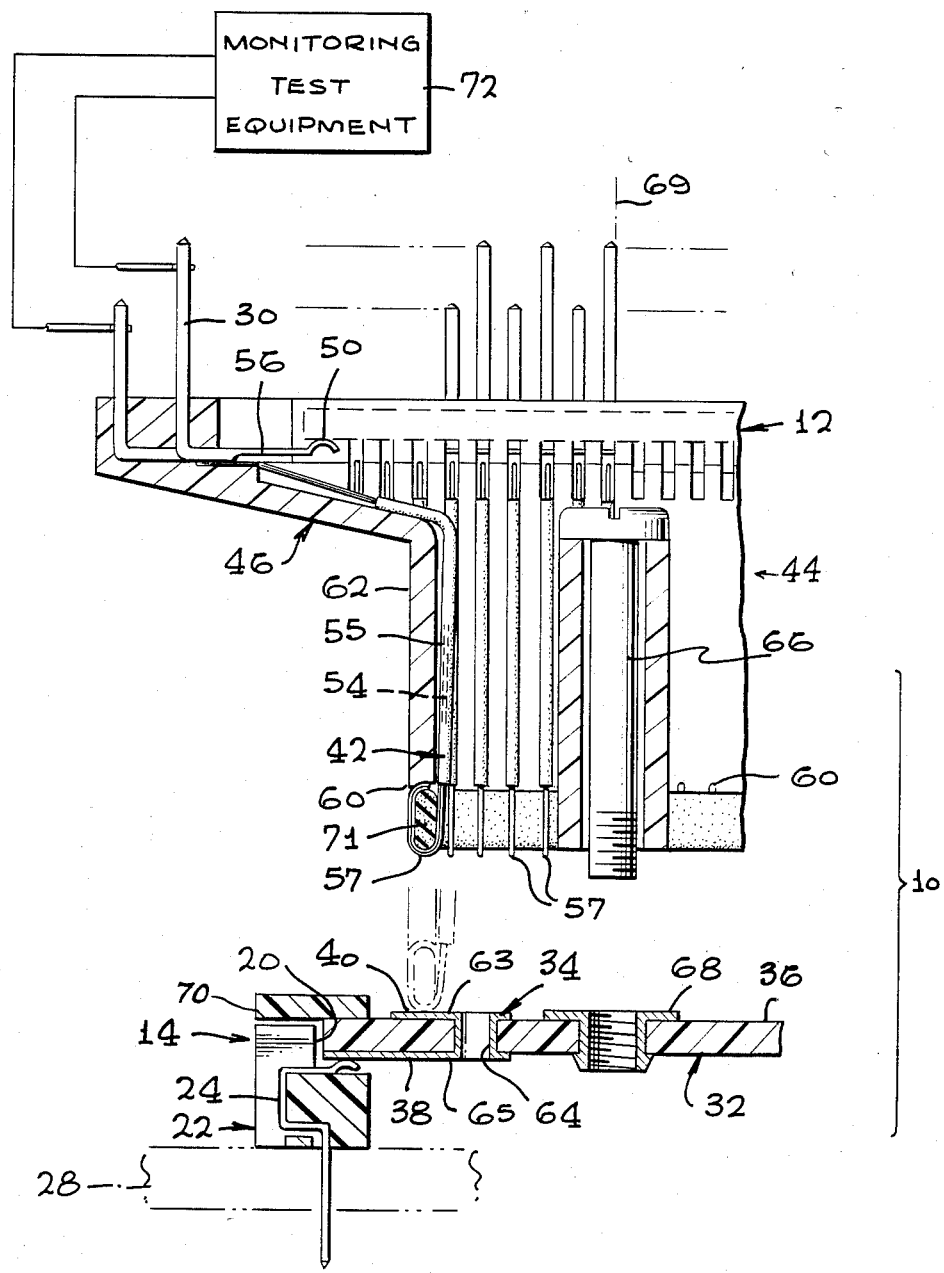
FIG. 2 is a partial sectional view of the adapter of FIG. 1.

FIG. 2 illustrates some of the details of the adapter 10. Each lead 42 includes an insulated contact lead or conductor 54 which extends along most of the height of the interfacer and is surrounded by an insulator 55. A contact element 56 connects to the top of the conductor. The contact element forms the inner portion 50 of the top of the lead and the outer portion or terminal 30 of the top of the lead. The bottom of the conductor forms a bottom contact 57 that can contact the conductive layer 63 of a base element pad 65. The interfacer frame 46 can be formed as a shell with four flat sides that have multiple holes 60. The conductor can have an extreme end inserted in one of the holes 60 that form lead retainers and can be wrapped around a resilient pad 71 of elastomeric material at the bottom of a frame side 62. The elastomeric material absorbs any dimensional differences to assure contact of all bottom contacts. The contact pads 34 on the base element can be formed by upper and lower conductive layers at 63 and 38, that are joined by a plated through hole 64. The bottom contact 57 of a lead can press on at least the conductive layer 63 to contact the plated through holes 64. Such contact can be maintained by a screw 66 on the interfacer that threads into a nut 68 on the base element, and that extends along the axis 69 of each part of the system. The insulated conductors 54 can be formed as portions of a flexible printed circuit, with the spacings of the conductive wires therein selected for use on the interfacer.

The equipment of FIG. 1 can be assembled for use by first inserting the base element 32 into the LCC socket 14 so that the contact pads 34 of the base element contact the terminals 24 of the socket. A lid 70 of the socket assembly can be installed over the base element to hold it in place. The lid 70 lies over only the periphery of the base element, to leave a wide central region of the base element that is uncovered. The test interfacer 44 is installed on the base element 32 by screwing the screw 66 into the nut 68 on the base element to hold them together and with the leads 42 engaged with the contact pads 34. The LCC 12 can then be installed in the interfacer 44. Monitoring or test instrument 72 (FIG. 2) can then be connected to the upstanding pins or terminals 30 to monitor signals transmitted between the LCC 12 and the terminals of the socket 14.

The adapter 10 also permits monitoring of signals passing through the socket terminals 24 in the absence of their connection to the LCC 12. This is accomplished merely by not installing the LCC 12 in the interfacer. Additionally, the interfacer permits testing of the LCC by equipment connected to the pins 30 when the LCC is not connected to the circuit on the printed circuit board. This is accomplished simply by not connecting the interfacer 44 to the base element or not installing the base element in the LCC socket.

Thus, the invention provides an adapter that enables the making of a connection between a LCC (Leadless Chip Carrier) and the terminals of a socket which connects to the circuit on a printed circuit board or the like, while permitting the monitoring of signals passing through the interface between the LCC and the circuit, by external test instruments. This can be accomplished using a relatively low cost LCC socket that is installed on a printed circuit board, rather than requiring a specialized socket. This is accomplished by the use of an adapter which has a base element that can fit into the receiver area of a LCC socket, of a type which has a hold-down lid that leaves a large central uncovered area.

The base element has contact pads forming the same contact footprints as the LCC which it temporarily replaces. An interfacer whose upper end can receive a LCC, has a lower end which can attach to the base element and has leads which extend between the contact pads of the base element and the contact pads of the LCC. The leads also include outer portions that are accessible from outside the interfacer for convenient connection of external test equipment to the LCC and the contacts of the LCC socket.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. An adapter for making connection between the contact pads of a LCC (Leadless Chip Carrier) which has multiple pads spaced about its periphery, and the terminals of a LCC socket that normally receives an LCC and connects the pads of the LCC to a circuit on a printed circuit board or the like, while permitting monitoring of the interface between the LCC contact pads and the socket terminals by test instruments, comprising:

a base element which is shaped to fit into a LCC socket, said base element having multiple contact pads at substantially its periphery which form substantially the same contact footprint as the LCC, said contact pads having inner portions lying inward of said periphery;

a test interfacer which includes a frame with a receiver for receiving a LCC and a multiplicity of leads, each lead having a lower end in electrical connection with the inner portions of said contact pads of the base element, a first upper portion that contacts the pads of the LCC held in the receiver, and a second upper portion that is accessible from outside the interfacer for connection to test instruments.

2. The adapter described in claim 1 wherein:

said LCC socket includes a frame which has multiple upwardly-facing terminals for contacting the lower surface of a LCC near the periphery where the contact pads of a LCC are located, said LCC socket also having a lid that lies over the peripheral portion of a LCC and which leaves most of the center of a LCC uncovered;

said base element has upper and lower faces; and said contact pads of said base element each have a plated-through hole spaced from the outer edge of the base element, a lower pad portion extending from the hole to the periphery of the element along the lower face of the base element, and an upper pad portion extending from the hole along the upper face of the base element, each of said leads in electrical connection with an upper pad portion.

3. The adapter described in claim 1 wherein:

said second upper portions of a plurality of said leads form upstanding pins that lie outside of said first upper lead portions.

4. The adapter described in claim 1 wherein:

said frame of said test interfacer includes a vertically extending shell having four sides, and having a row of through holes in at least some of the sides at locations above the extreme bottom of the side to form lead retainers beneath the holes;

a plurality of said leads extend vertically along said shell, said plurality of leads comprise a plurality of conductors and insulation portions that surround said conductors; and the bottom of said conductors being free of insulation covering and wrapped about said lead retainers, and lying in said holes.

5. The adapter described in claim 4 wherein:

at least a lower portion of each retainer is formed of elastomeric material, so the retainers can be compressed to assure that all leads make contact.

6. A method for connecting the contact pads of a LCC (lLeadless Chip Carrier) to the terminals of a LCC socket that normally receives a LCC and connects the pads of the received LCC to a circuit of a printed circuit board or the like, and for connecting test equipment between the interface of the LCC contact pads and the terminals of the LCC socket, comprising:

installing a base element in the LCC socket in the place normally occupied by a LCC, wherein the base element has multiple contact pads with outer portions that contact the terminals of the LCC socket and also has inner portions spaced inwardly from the periphery;

installing a test interfacer on said base element wherein the interfacer includes a receiver which can receive a LCC and also includes leads, including making electrical contact between lower ends of said leads and said inner portions of said base element contact pads;

installing a LCC in said receiver of said interfacer with the contact pads of the LCC in contact with upper ends of the leads; and connecting test equipment to said leads, whereby to enable monitoring of the operation of a LCC when connected through a LCC soket to a printed circuit board or the like where the LCC socket is a low cost type which normally directly receives and contacts the LCC.

7. An adapter for making connection between the contact pads of a LCC (Leadless Chip Carrier) which has multiple pads spaced about its periphery, and the terminals of a LCC socket that normally receives an LCC and connects the pads of the LCC to a circuit on a printed circuit board or the like, while permitting monitoring of the interfaces between the LCC contact pads and the socket terminals by test instruments, comprising:

a base that has a base element frame with upper and lower faces and that can fit into said LCC socket, said base also having multiple base contact pads, each base contact pad including a metal-plated hole, a lower portion on the lower face of the frame extending from the hole to the periphery of the frame, and an upper portion on the upper face of the frame and extending from the hole;

a test interfacer which includes an interfacer frame forming a receiver for receiving a LCC, and a plurality of leads, each lead including inner and outer upper portions with said inner portions positioned to contact the pads of a LCC in the receiver and said outer portions accessible to connection to separate test equipment lying outside the interfacer frame, said leads having lower portions positioned to engage said upper portions of said base contact pads; and including means for fastening said test interfacer to said base so said lower portions of said leads engage said upper portions of said base contact pads.

* * * * *